(12) United States Patent
Horie

(10) Patent No.: US 7,447,962 B2
(45) Date of Patent: Nov. 4, 2008

(54) JTAG INTERFACE USING EXISTING I/O BUS

(75) Inventor: Kimito Horie, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 344 days.

(21) Appl. No.: 11/255,150

(22) Filed: Oct. 21, 2005

(65) Prior Publication Data

US 2006/0156106 A1    Jul. 13, 2006

(30) Foreign Application Priority Data

Jan. 7, 2005   (JP) .............................. 2005-002553

(51) Int. Cl.
    *G01R 31/28* (2006.01)
(52) U.S. Cl. ..................... 714/727; 714/726
(58) Field of Classification Search .......... 714/724–731
    See application file for complete search history.

(56) References Cited

U.S. PATENT DOCUMENTS

| 5,477,545 | A | * | 12/1995 | Huang ........................ 714/727 |
| 5,487,074 | A | * | 1/1996 | Sullivan ...................... 714/727 |
| 6,539,536 | B1 | * | 3/2003 | Singh et al. ................... 716/18 |
| 6,988,232 | B2 | * | 1/2006 | Ricchetti et al. ............ 714/736 |
| 7,159,159 | B2 | * | 1/2007 | Sunter ........................ 714/724 |
| 2005/0204225 | A1 | * | 9/2005 | Whetsel ...................... 714/726 |

FOREIGN PATENT DOCUMENTS

| JP | 09-015300 | 1/1997 |
| JP | 11-326460 | 11/1999 |

\* cited by examiner

*Primary Examiner*—Jacques Louis-Jacques
*Assistant Examiner*—Steve Nguyen
(74) *Attorney, Agent, or Firm*—Rabin & Berdo, P.C.

(57) ABSTRACT

A plurality of input circuits and a plurality of output circuits are connected to form a Boundary Scan Path Chain (BSPC). Part or all of the existing I/O bus is used as a test bus. When a test target system such as a logic circuit is tested, data of the input circuits is circulated in the BSPC to set the initial state. After a system clock is activated, data of the input circuits is loaded into shift registers provided in the input circuits or data of the output circuits is loaded into shift registers provided in the output circuits. A shift clock is activated to extract the data of the input or output circuits through the BSPC. Enable data is circulated in the BSPC, and data of the output circuits is supplied to the test bus only when the enable data is active.

3 Claims, 10 Drawing Sheets

FIG. 6

| | NORMAL OPERATION Test/Norm=0 | TEST OPERATION Test/Norm=1 |
|---|---|---|
| JTAG ModeCh=0 | INPUT VALUE (42-1) > I/O BUS | REGISTER VALUE (41) > I/O BUS AND INPUT VALUE (42-1) > SCAN PATH |
| EXTENDED JTAG ModeCh=1 | INPUT VALUE (42-1) > I/O BUS | REGISTER VALUE (41) > I/O BUS AND INPUT VALUE (42-1) > SCAN PATH OR INPUT VALUE (42-1) > SUBSTITUTE BUS |

FIG. 7

| | NORMAL OPERATION Test/Norm=0 | TEST OPERATION Test/Norm=1 |
|---|---|---|
| JTAG ModeCh=0 | OUTPUT VALUE (44-1) > OUTPUT PORT | REGISTER VALUE (41) > OUTPUT PORT AND OUTPUT VALUE (44-1) > SCAN PATH |
| EXTENDED JTAG ModeCh=1 | OUTPUT VALUE (44-1) > OUTPUT PORT | REGISTER VALUE (41) > OUTPUT PORT AND OUTPUT VALUE (44-1) > SCAN PATH OR OUTPUT VALUE (44-1) > SUBSTITUTE BUS |

FIG. 11

| | NORMAL OPERATION Test/Norm=0 | TEST OPERATION Test/Norm=1 |
|---|---|---|
| JTAG ModeCh=0 | INPUT VALUE (42-1) > I/O BUS | REGISTER VALUE (41) > I/O BUS AND INPUT VALUE (42-1) > SCAN PATH |
| EXTENDED JTAG ModeCh=1 | INPUT VALUE (42-1) > I/O BUS | INPUT VALUE (44-2) > I/O BUS AND OUTPUT VALUE (44-1) > SCAN PATH OR INPUT VALUE (42-1) > SUBSTITUTE BUS |

FIG. 12

| | NORMAL OPERATION Test/Norm=0 | TEST OPERATION Test/Norm=1 |
|---|---|---|
| JTAG ModeCh=0 | OUTPUT VALUE (44-1) > OUTPUT PORT | REGISTER VALUE (41) > OUTPUT PORT AND OUTPUT VALUE (44-1) > SCAN PATH |
| EXTENDED JTAG ModeCh=1 | OUTPUT VALUE (44-1) > OUTPUT PORT | OUTPUT VALUE (44-2) > OUTPUT PORT AND OUTPUT VALUE (44-1) > SCAN PATH OR OUTPUT VALUE (44-1) > SUBSTITUTE BUS |

JTAG INTERFACE USING EXISTING I/O BUS

BACKGROUND OF THE INVENTION

1. Field of the Invention

The present invention relates to a test system using an extended Joint Test Action Group (JTAG) interface, and more particularly to a test system which is provided on a printed circuit board or a semiconductor chip having a test target system such as a logic circuit and which tests the test target system by circulatively setting or obtaining enable data and input/output data in such a semiconductor chip.

2. Description of the Related Art

A technology, which is referred to as JTAG or Boundary Scan, has been developed in the early 1990's and has been helpful in treating inspection or test-related problems, caused by difficulty in physical access to devices such as multilayer Printed Circuit Boards (PCB), Ball Grid Arrays (BGA), and integrated circuits having a number of pins due to significant evolution of such devices. Currently, this technology is standardized as IEEE1149.1 and is used even for writing to nonvolatile memories on multilayer PCBs or the like.

A serial interface of 4 terminals (with an optional fifth terminal) for accessing complicated integrated circuits or the like is defined in IEEE1149.1. A test system according to IEEE1149.1 is described, for example, in Japanese Patent Application Kokai (Laid-open Application) No. 9-15300 and No. 11-326460. The test systems of these Japanese Patent Application Kokai are referred to as "conventional test system" in the following description.

FIG. 13 of the accompanying drawings is a conceptual diagram illustrating the architecture of a device including an integrated circuit on which such a conventional test system is provided, and FIG. 14 is a schematic diagram illustrating the configuration of a boundary scan circuit on which a plurality of the devices of FIG. 13 is provided.

A device 10 shown in FIG. 13 has an internal core logic circuit 11 which is a test target system. A plurality of data input terminals "IN" and a plurality of data output terminals "OUT" are connected to the internal core logic circuit 11 via an input/output (I/O) bus (not shown). A plurality of boundary scan cells (BSC) for performing boundary scan functions are provided between the internal core logic circuit 11 and the data input terminals "IN" and between the internal core logic circuit 11 and the data output terminals "OUT". The BSCs 12 are each a 1-bit shift register capable of setting test data, and they are connected in series to form a Boundary Scan Path Chain (BSPC). A Test Access Port (TAP) 13 is provided to control input/output of the BSPC. The TAP 13 includes a bypass register, an Instruction Register (IR), a device identification (ID) register, a TAP control circuit, etc. A state machine for performing the boundary scan function is provided in the TAP control circuit.

Standard serial interface terminals, for example, 5 terminals (i.e., a test data input terminal (TDI), a test data output terminal (TDO), a test clock input terminal (TCK), a test mode selection terminal (TMS), and a test logic reset input terminal (TRST*) are connected to the TAP 13. Data input to the device 10 through the terminal TDI is stored in either the instruction register or the data register in the TAP 13. Data from the device 10 is output through the terminal TDO. The BSPC, composed of a plurality of the BSCs 12, operates according to a test clock supplied through the terminal TCK. The test clock of the terminal TCK is independent of a system clock sck. The system clock sck is used to operate the device 10. The state of the TAP 13 is controlled based on a signal from the terminal TMS. A signal from the terminal TRST* is optional and is used as a hardware reset signal.

The operation of the internal core logic circuit 11 and the operation of the test circuit composed of the BSCs 12 and the TAP 13 are switched according to the signal of the terminal TMS which is synchronized with the test clock of the terminal TCK. Specifically, according to the signal of the terminal TMS, the path of test data in the device 10 (internal scan path) is switched between the path "terminal TDI→BSCs 12→terminal TDO" and the path "terminal TDI→bypass register in TAP 13→terminal TDO". During test operation, according to the signal of the terminal TMS, the path of test data is the path "terminal TDI→shift registers in BSCs 12→terminal TDO", and the test data is set in the BSCs 12. Then, the internal core logic circuit 11 is tested based on the test data.

A BSPC, which is a boundary scan chain, can be formed by connecting a plurality of such devices 10 (for example, six devices 10-1 to 10-6) in series on a printed circuit board 20 as shown in FIG. 14. Thus, a "chain" is formed on the printed circuit board 20. Specifically, terminals TDI and TDO of the devices 10-1 to 10-6 are connected in series on the printed circuit board 20, thereby forming a single scan path. Both ends of this scan path are connected to terminals ATDI and ATDO on an edge connector 21 of the printed circuit board 20.

If a JTAG control circuit, which is provided externally to perform boundary scan test, sets test data for testing manufacturing failure of the printed circuit board 20 to a test target device (for example, to a test data setting point P of the device 10-3), the test data is serially input to the device 10-1, which is the first device on the scan path, through the terminal ATDI and the terminal TDI of the device 10-1, and the input test data is output from the device 10-1 through a terminal TDI of the device 10-1 after passing through a bypass register in a TAP 13 thereof. The test data proceeds through a terminal TDI, a bypass register, and a terminal TDO of the device 10-2. Subsequently, the test data is input to the test target device 10-3 through a terminal TDI of the device 10-3 so that the test data is set in the BSCs 12 in the device 10-3. After the test is completed, the test data is output from the test target device 10-3 through a terminal TDO of the device 10-3. The test data passes through bypass circuits of the downstream devices 10-4 and 10-5. The test data is supplied from a terminal TDO of the last device 10-6 to the terminal ATDO of the edge connector 21.

Such a scan operation provides a capability to test a structural failure of the printed circuit board 20 occurring when it is manufactured and a capability to perform in-system programming. This significantly reduces the number of spots of the printed circuit board 20 which need to be tested. The scan operation also makes it possible to directly enjoy advantages such as a simplified layout of the printed circuit board 20, low-cost test equipment, reduced test time, an additional use of a standard interface, and adaptation to the market.

Despite these excellent features, the JTAG has encountered limitations with recent large-scale devices 10 or PCBs.

First, 1-bit serial data transfer requires a device 10 having 100 or more (terminals) pins to have a number of clocks for setting inputs or extracting outputs for test. This imposes a large burden on the external JTAG control circuit which controls the test target device (for example, the device 10-3 in FIG. 14). Also, there are limitations in reducing the test time. The 1-bit serial data transfer also causes a problem in writing to a flash memory or the like using the boundary scan circuit. In the current technology, the flash memory write time is about 1 ms/page (one page is, for example, 512 bytes in size), and the 1-bit serial data must be converted into pages, so that a significant processing load is also imposed on the external JTAG control circuit.

Second, even if multiple bit serial data transfer (for example, a multiple bit test bus) is implemented to solve the above problems, the volume of the test circuitry is increased and the chip cost of the device 10 is increased since the test bus must be wired around all the input/output terminals or pins and the number of test terminals is also increased.

SUMMARY OF THE INVENTION

Thus, there is a need to provide a test system for efficiently testing devices or PCBs having a large number of terminals or pins (for example, 100 or more terminals or pins). As the number of terminals increases, the difficulty in testing large-scale systems increases and the test cost issue becomes serious. The number of terminals is increased if the test bus is used. The excellent features of the JTAG should not be sacrificed by the adoption of the test bus.

Thus, one object of the present invention is to provide a test system that employs an extended-JTAG interface, while taking advantage of the existing resources.

According to a first aspect of the present invention, there is provided a test system that includes a test target system operating according to a system clock, and a test bus implemented using part or all of an I/O bus. The I/O bus is originally designed for transferring input and output data in the test target system. The test system also includes a plurality of input circuits. Each input circuit has a first shift register operating according to a shift clock independent of the system clock. Each input circuit supplies data input from an associated input port to the test target system via the test bus. The test system also includes a plurality of output circuits. Each output circuit has a second shift register operating according to the shift clock. Each output circuit outputs data, which has been sent from the test target system to the test bus, to an associated output port. The first shift registers and the second shift registers are connected in series to form a scan path chain in the test system.

When the test target system is tested, initial state setting is performed by circulating data of the input circuits in the scan path chain. After the system clock is activated, data of the input circuits is loaded into the first shift registers or data of the output circuits is loaded into the second shift registers, and the shift clock is activated to extract data of the input circuits or data of the output circuits from the scan path chain. In addition, enable data is circulated in the scan path chain, and data of the output circuits is supplied to the test bus only when the enable data is active.

The present invention provides extension of the conventional JTAG. Although a test bus is additionally employed, the test bus is implemented using the existing I/O bus so as to avoid an increase in the volume of the test circuitry. Hereinafter, the test bus implemented using part or all of the existing I/O bus according to the present invention is referred to as a substitute bus.

For example, a function to circulate enable data EnData for determining whether to output data of a plurality of input/output circuits including a plurality of input circuits and a plurality of output circuits which constitute a scan path chain is further implemented instead of shifting data in a BSPC, which is a chain of 1-bit shift registers, when boundary scanning is performed. If the enable data EnData admits (enables) data input/output of the input/output circuits, their input/output data is output to the substitute bus. This data is then output through test terminals which are additionally provided or which utilize the existing input and output terminals. Then, the data output through the test terminals is coupled to a next JTAG interface chain and is finally transmitted to an external JTAG control circuit or the like. On the contrary, if the enable data EnData disables data input/output of the input/output circuits, the input/output circuits are not selected. In addition, a special register (i.e., a mode switching register) is provided to switch between the enable data EnData and the data shifted in the BSPC.

Conventionally, testing is performed in the following manner. First, initial setting is performed for input and output circuits. Then, the input and output circuits are operated in normal mode. After that, the operating results of the input and output circuits are obtained through a boundary scan circuit. On the contrary, in the present invention, testing can be performed according to a test scheme unique to the present invention. First, initial setting is performed for input and output circuits, and the input and output circuits are operated in normal mode. Then, the operating results of the input and output circuits are obtained through the substitute bus.

The input and output circuits operate in the conventional JTAG mode if the mode switching register selects actual data of the input and output circuits as the data which should flow in the scan path chain. The scan path chain is a chain of shift registers. On the contrary, only input and output circuits selected by the enable data can output input/output data to the substitute bus if the mode switching register selects the enable data. Here, the substitute bus can be utilized as a test bus if the circulating enable data has a sequence of consecutive enable bits and the number of the enable bits of the enable data matches the bit width of the substitute bus. Generally, there is no need to match the number of enable bits of the circulating enable data to the bit width of the substitute bus. In such a case, the degree of freedom in the test is increased. The enable bit sequence is not necessarily shifted in 1-bit units. If the enable bit sequence is shifted in multiple bit units, the test efficiency is increased.

According to the present invention, for example, an m-bit test bus is created using the existing I/O bus, and the speed of reading input/output data can be increased m-fold using a shift clock provided for shifting m bits per clock while restricting an increase in the volume of the test circuitry. In addition, a function to output the output data loaded into the second shift register to the test bus can be added to the output circuit. The test bus can be in effect provided additionally, while maintaining the conventional JTAG function. Thus, the test system is also of practical use in extending the JTAG features. Accordingly, it is possible to more easily test devices such as built-in devices, PCBs and integrated circuits, which have a large number of pins and have a complicated configuration. It should be noted that although the existing I/O bus is used to save the resources, a new test bus can be introduced when the integrated circuits have some leeway.

In accordance with another aspect of the present invention, there is provided a test system which includes a test target system operating according to a system clock. The test system also includes a test bus implemented using part or all of an I/O bus. The I/O bus is originally designed to transfer input and output data in the test target system. The test system also includes a plurality of input circuits. Each input circuit includes a first input register connected to the test bus and a first shift register operating according to a shift clock independent of the system clock. Each input circuit supplies data given from an associated input port to the test target system via the test bus. The test system also includes a plurality of output circuits. Each output circuit includes a second input register connected to the test bus and a second shift register operating according to the shift clock. Each output circuit sends data, which has been supplied from the test target system to the test bus, to an associated output port. The first shift registers and the second shift registers are connected in series to form a scan path chain in the test system.

When the test target system is tested, initial state setting is performed by setting input and output data on the test bus to the first and second input registers. After the system clock is activated, data of the input circuits is loaded into the first shift registers or data of the output circuits is loaded into the second shift registers, and the shift clock is activated to extract data of the input circuits or data of the output circuits from the scan path chain.

This test system makes it possible to input data from the substitute bus to the input and output circuits, so that the substitute bus is utilized even during initial setting of the input and output circuits. As a result, the substitute bus functions as an independent test bus.

Conventionally, testing is performed in the following manner. First, initial setting is performed for input and output circuits. Then, the input and output circuits are operated in normal mode. After that, the operating results of the input and output circuits are obtained through a boundary scan circuit. On the contrary, in the present invention, testing can be performed according to a test scheme unique to the present invention. Specifically, first, initial setting is performed for input and output circuits through the substitute bus, and the input and output circuits are operated in normal mode. Then, the operating results of the input and output circuits are obtained through the substitute bus.

The input and output circuits operate in the conventional JTAG mode if the mode switching register selects actual data of the input and output circuits as the data which should flow in the scan path chain. On the contrary, only input and output circuits selected by the enable data can output input/output data to the substitute bus if the mode switching register selects the enable data. Here, the substitute bus can be utilized as a test bus if the circulating enable data EnData has a sequence of consecutive enable bits and the number of the enable bits of the enable data matches the bit width of the substitute bus. Generally, there is no need to match the number of enable bits of the circulating enable data EnData to the bit width of the substitute bus. In such a case, the degree of freedom in the test is increased. The enable bit sequence is not necessarily shifted in 1-bit units. If the enable bit sequence is shifted in multiple bit units, the test efficiency is increased.

According to this test system, a more advanced use of the substitute bus as the test bus is provided, in which the input and output data can be input from the substitute bus. Accordingly, although the volume of the circuit is increased, it is possible to perform initial setting of the input and output circuits, and also to read input/output data directly from the specified input and output circuits. This significantly increases the degree of freedom in the test. For example, since an m-bit test bus is in effect created using the existing I/O bus, the speed of reading input/output data can be increased m-fold using a shift clock provided for shifting m bits per clock.

When the test target system is tested, initial state setting may be performed by setting input and output data on the test bus to the first and second input registers. After the system clock is activated, data of the input circuits or data of the output circuits may be supplied to the test bus.

Alternatively, after the initial state setting is completed and the system clock is activated, enable data may be circulated in the scan path chain, and data of the input and output circuits may be sent to the test bus if values of the first and second shift registers are active whereas data of the input and output circuits may not be sent to the test bus if values of the first and second shift registers are inactive.

BRIEF DESCRIPTION OF THE DRAWINGS

The above and other objects, features, aspects and advantages of the present invention will be more clearly understood from the following detailed description and appended claims, when read and understood in conjunction with the accompanying drawings, in which:

FIG. 6 is a table illustrating the comparison between expected outputs of an input port in the conventional JTAG and in the enhanced JTAG according to the first embodiment;

FIG. 7 is a table illustrating the comparison between expected outputs of an output port in the conventional JTAG and in the enhanced JTAG according to the first embodiment;

FIG. 11 is a table illustrating the comparison between expected outputs of an input port in the conventional JTAG and in the enhanced JTAG according to the second embodiment;

FIG. 12 is a table illustrating the comparison between expected outputs of an output port in the conventional JTAG and in the enhanced JTAG according to the second embodiment;

DETAILED DESCRIPTION OF THE INVENTION

First Embodiment

Figure 1:
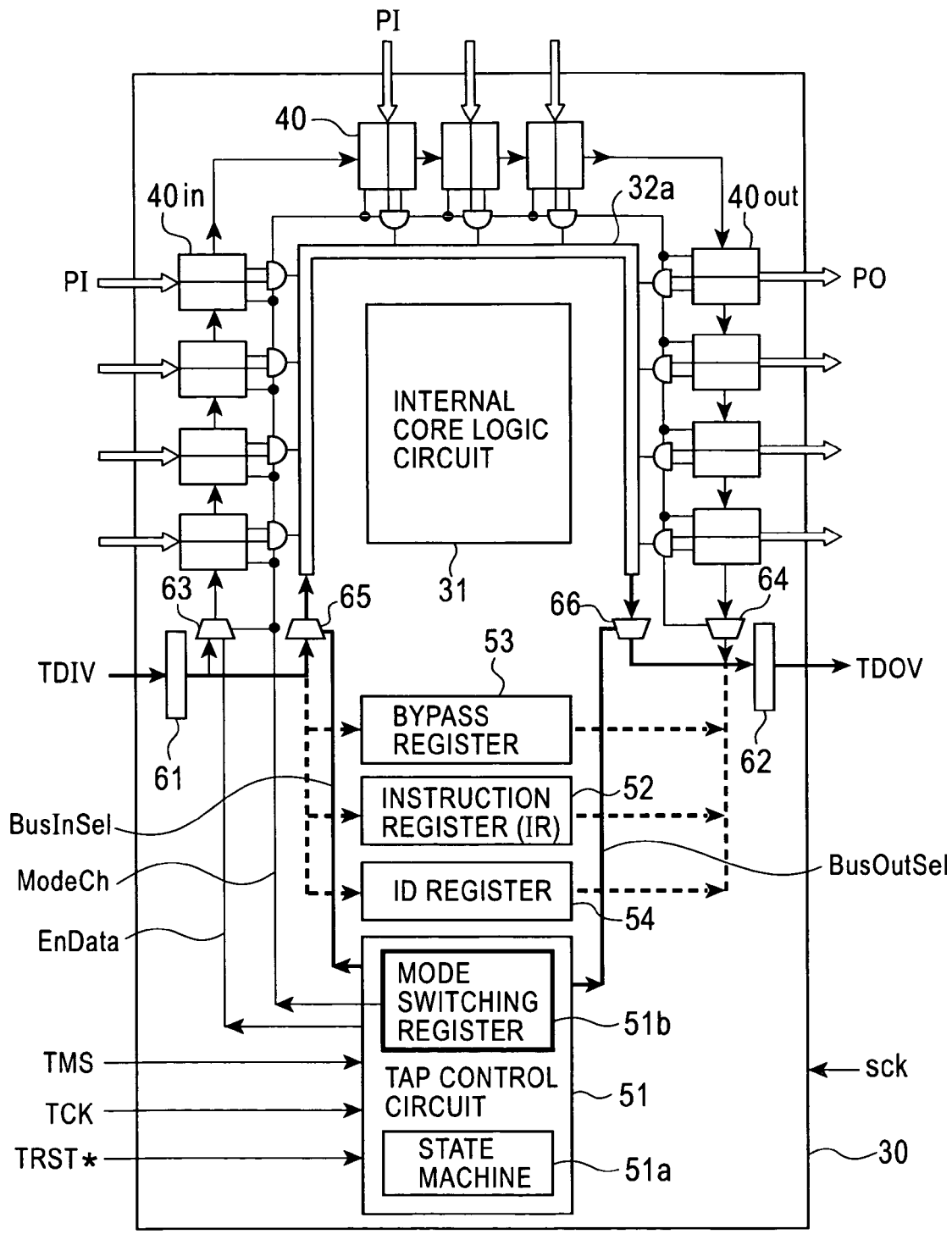
FIG. 1 is a schematic diagram illustrating a test system according to a first embodiment of the present invention.

Referring to FIG. 1, a test system according to a first embodiment of the present invention will be described.

The test system uses an extended JTAG interface, which is extended from a conventional JTAG interface, and includes a device 30 having an integrated circuit or the like with more than 100 terminals (or pins). A plurality of input ports PI through which data is introduced to the device 30, a plurality of output ports PO through which data is output from the device 30, and terminals TDIV, TDOV, TMS, TCK, and TRST* for extended JTAG interface signals are provided at outer portions of the device 30. A test target system 31, which operates according to a system clock sck, is provided inside the device 30. An example of the test target system is an internal core logic circuit composed of a variety of circuits. The number of pins of the input ports PI is typically more than 100 and the number of pins of the output ports PO is also typically more than 100. The terminal TDIV is a terminal through which an m-bit test data input vector is input where 'm' is an integer greater than 1, for example, 4. The terminal TDOV is a terminal through which an m-bit test data output vector is output. The terminal TMS is a terminal through which a test mode selection signal is input. The terminal TCK is a terminal through which a test clock is input. The terminal TRST* is an optional terminal through which a test logic reset signal is input.

As in the prior art, around the internal core logic circuit 31 is provided an I/O bus 32 (FIG. 3) which is 16, 32, or 64 bits wide and which transfers input/output data of the circuit 31. A first feature of this embodiment is to use part or all of the conventional I/O bus 32 as a test bus, which is an m-bit (for example, 4-bit) substitute bus 32*a*. A separate test bus 32*a* is provided if the conventional I/O bus 32 cannot be used. Such a substitute bus 32*a* is connected to the internal core logic circuit 31 through a signal line and transfers I/O data of the internal core logic circuit 31. The substitute bus 32*a* is connected to input/output circuits 40 including a plurality of input circuits 40in and a plurality of output circuits 40out which constitute a Boundary Scan Path Chain (BSPC). Each of the input and output circuits 40in and 40out is a circuit corresponding to a conventional Boundary Scan Cell (BSC) in which an m-bit (for example, 4-bit) shift register is provided. The m-bit shift registers provided in the input and output circuits 40in and 40out are connected in series.

Each of the input circuits 40in selects either 4-bit data input from a corresponding one of the input ports (i.e., associated input port) PI or 4-bit data of its previous (upstream) circuit received via a scan path and then outputs the selected 4-bit data to the substitute bus 32*a*, or shifts and transfers the 4-bit data of the previous circuit to its next (downstream) circuit. Each of the output circuits 40out selects either 4-bit data input from the substitute bus 32*a* or 4-bit data of its previous circuit received via the scan path and then outputs the selected 4-bit data to a corresponding one of the output ports (associated output port) PO, or shifts and transfers the 4-bit data of the previous circuit to its next circuit. A Test Access Port (TAP) is provided to control the operation of the input and output circuits 40. The TAP includes a TAP control circuit 51, an Instruction Register (IR) 52 performing input and output operations in units of 4 bits, a bypass register 53 performing input and output operations in units of 4 bits, and a device identification register 54 (hereinafter referred to as an "ID register") performing input and output operations in units of 4 bits.

The TAP control circuit 51 is a circuit which receives signals from the terminals TMS, TCK, and TRST* and outputs various control signals such as enable data EnData, a mode switching signal ModeCh, and substitute bus selection signal vectors BusInSel and BusOutSel. The TAP control circuit 51 includes a state machine 51*a* for outputting control signals ShClock, Wd, Wr, BusEn, and Test/Norm, and mode switching means (for example, a mode switching register) 51*b* for outputting the mode switching signal ModeCh. The TAP control circuit 51 has a function to select and operate one of the shift registers, which are data registers (DR), in the input and output circuits 40, an ID register 54, and a bypass register 53 according to an instruction stored in the instruction register 52. The bypass register 53 has a function to transfer data from the terminal TDIV to the terminal TDOV when the state machine 51*a* is in a Shift-DR (bypass) state. The ID register 54 is used to serially read an identification code from the device 30. The identification code indicates the part number, the version, and the like of the device 30.

The terminal TDIV is switchably connected to either the input-side multiplexers 63 and 65 for use in data selection, or the bypass register 53, the instruction register 52, and the ID register 54 provided in the TAP via the input switching circuit 61. An output of the input-side multiplexer 63 is connected to the first input circuit 40in, and an output of the other input-side multiplexer 65 is connected to the substitute bus 32*a*. The input-side multiplexer 63 is a circuit which selects either the input data from the input switching circuit 61 or the enable data EnData from the TAP control circuit 51 based on the mode switching signal ModeCh supplied from a mode switching register 51*b*, and provides the selected data to the first input circuit 40in. The other input-side multiplexer 65 is a circuit which selects the bits of input data from the input switching circuit 61 based on an input control signal BusInsel (for example, a substitute bus selection signal vector) from the TAP control circuit 51, and provides the selected data to the substitute bus 32*a*.

That is, like the prior art the BSPC formed by connecting the input and That is, like the prior art the BSPC formed by connecting the input and output circuits 40 remains unchanged, and the lowest significant bit (LSB) of the 4-bit TDIV signal corresponds to the conventional 1-bit TDI signal. The multiplexer 63 selects an LSB of an TDIV signal from the input switching circuit 61 and circulates the selected LSB in the BSPC when the mode switching signal ModeCh received from the mode switching register 51*b* is inactive (i.e., has a low logic value "L"). The multiplexer 63 selects the enable data EnData from the TAP control circuit 51 and circulates the selected data EnData in the BSPC when the mode switching signal ModeCh is active (i.e., has a high logic value "H"). Setting of the mode switching register 51*b* is performed when the setting state of the mode switching register 51*b* is selected according to the TMS signal.

The device has an output-side structure similar to the input side structure. Specifically, an output-side multiplexer 64 is connected to the last output circuit 40out, and an output-side multiplexer 66 is connected to the substitute bus 32*a*. In addition, either these multiplexers 64 and 66 or the bypass register 53, the instruction register 52, and the ID register 54 provided in the TAP are connected to a 4-bit terminal TDOV via an output switching circuit 62. The output-side multiplexers 64 is a circuit which selects a signal output from the last output circuit 40out according to the mode switching signal ModeCh supplied from the mode switching register 51*b*, and feeds the selected output signal to the output switching circuit 62. The other output-side multiplexer 66 is a circuit which selects a signal output from the substitute bus 32*a* according to an output control signal (for example, the substitute bus selection signal vector) BusOutSel supplied from the TAP control circuit 51, and feeds the selected output signal to the output switching circuit 62.

An LSB of the 4-bit TDIV signal corresponds to the conventional 1-bit TDI signal. If the input switching circuit 61 circulates an LSB input of the TDIV signal in the BSPC, the mode switching signal ModeCh supplied from the mode switching register 51*b* is set to inactive ("L"). If the mode switching signal ModeCh is inactive, the multiplexer 64 selects the LSB input. Accordingly, it is possible to specify the input data and also to output the corresponding output data as a TDO signal via the output switching circuit 62 after passing it through the BSPC as in the conventional JTAG. That is, the first embodiment maintains JTAG compatible functions.

Figure 2:
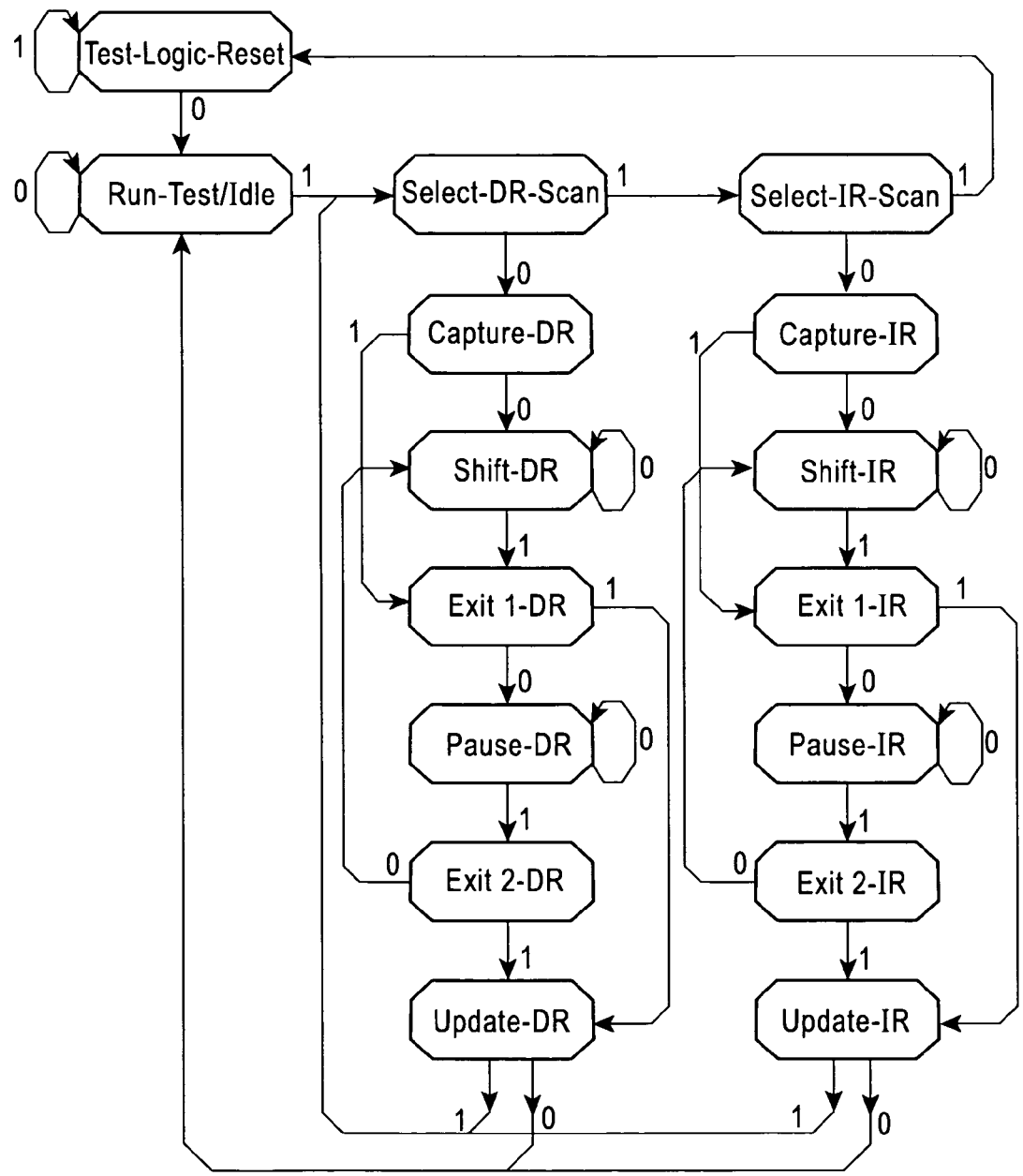
FIG. 2 is a state transition diagram of a TAP control circuit shown in FIG. 1.

FIG. 2 is a state transition diagram of the TAP control circuit 51 shown in FIG. 1. This state transition diagram is based on 1-bit control as in the prior art.

The state of the TAP control circuit 51 is changed, for example, on the rising edge of the TCK signal according to whether the TMS signal has a high logic value "1" or a low logic value "0". In FIG. 2, the logic value of the TMS signal is denoted at one side of each arrow indicating the state transition. The left column in FIG. 2 is a data column of data registers (DR) such as the bypass register 53, the ID register 54, and the shift register in each of the input and output circuits 40, and the right column is an instruction column of an instruction register (IR) 52.

For example, the ID register 54 is selected as default if the TAP control circuit 51 is in a Reset state according to the TRST* signal when the TAP control circuit 51 is in a Test-Logic-Reset state. A most significant bit (MSB) of the shift register in each of the input and output circuits 40 is cleared to "0", and the output is disabled. The TAP control circuit 51 remains in the Test-Logic-Reset state during a period in which the TMS signal is "1". The TAP control circuit 51 transits to a Run-Test/Idle state if "0" is introduced to the terminal TMS in the Test-Logic-Reset state.

In the Run-Test/Idle state, the device 30 enters the test mode only when a specific instruction such as a Built-In Self-Test (BIST) instruction is given. For an instruction not executed in the Run-Test/Idle state, a test DR selected by the current instruction remains in the previous state. The TAP control circuit 51 remains in the Run-Test/Idle state during a period in which the TMS signal is "0". The TAP control circuit 51 transits to a Select-DR-Scan state if "1" is input to the terminal TMS.

The Select-DR-Scan state is a temporary state of the TAP control circuit 51 in which the device 30 does not perform any specific operation. The TAP control circuit 51 transits to a Capture-DR state if "0" is supplied to the terminal TMS when the TAP control circuit 51 is in the Select-DR-Scan state. The TAP control circuit 51 transits to a Select-IR-Scan state of the instruction column if "1" is supplied to the terminal TMS.

The Select-IR-Scan state is a temporary state of the TAP control circuit 51 in which the device 30 does not perform any specific operation. The TAP control circuit 51 returns to the Test-Logic-Reset state if "1" is supplied to the terminal TMS when the TAP control circuit 51 is in the Select-IR-Scan state.

When the TAP control circuit 51 is in a Capture-IR state, data are loaded to the instruction register (IR) 52 in parallel. In this Capture-IR state, the TAP control circuit 51 is used to test the instruction register 52. Failure of the instruction register 52 can be detected by shifting out the loaded data. The TAP control circuit 51 transits to a Shift-IR state if "0" is supplied to the terminal TMS when the TAP control circuit 51 is in the Capture-IR state. The TAP control circuit 51 transits to an Exit-IR state if "1" is introduced to the terminal TMS.

In the first embodiment, setting of the mode switching register (MR) 51b is performed according to an instruction given in the above-described state transition. If the mode switching register 51b is set via an MR-Set instruction, the TAP control circuit 51 enters the extended-JTAG mode of this embodiment. If the mode switching register 51b is reset via the MR-Set instruction, the TAP control circuit 51 enters the conventional JTAG mode. Thus, there is a need to provide the instruction according to the first embodiment in addition to the instruction set of the conventional JTAG. Although setting of the mode switching register 51b can also be performed with the state transition diagram, this is not employed due to its complexity and taking into account that this embodiment is an extension of the conventional JTAG. Although the state transition diagram based on 1-bit control is illustrated as in the prior art, it is possible to assign a plurality of bits to state transitions so that state transitions can be made according to respective values of the bits. As an example of such extension, 2 bits can be assigned to the TMS signal so that state transitions can be made according to the 2-bit values of the TMS signal.

The first embodiment is characterized by using the substitute bus 32a. That is, an actual general-purpose test bus is created utilizing the existing I/O bus which is 16, 32, or 64 bits wide. In the first embodiment, the terminals TDIV and TDOV, which are test ports, are 4 bits wide. Therefore, in the case where the general-purpose test bus is 4 or more bits wide, the substitute bus selection signal vector BusInSel is set to allow the multiplexer 65 to select 4 bits used for the test bus.

If the existing I/O bus is used for the test, the I/O bus must be released when the internal core logic circuit 31 needs to use the I/O bus. Thus, the inputs and outputs of all the input and output circuits 40 (other than the test ports), which are connected to the I/O bus, are temporarily disconnected from the I/O bus. This disconnection is made by the mode switching signal ModeCh supplied from the TAP control circuit 51.

In the JTAG, when the device 30 performs its processing, data bypasses the input and output circuits so that the TDI signal is output as a TDI signal via the 1-bit bypass register 53. The first embodiment handles a 4-bit TDIV signal, so that the bypass register 53 is configured so as to perform input and output operations in units of 4 bits. An output of the bypass register 53 is introduced to a device 30 connected to the next chain via the terminal TDOV.

If the substitute bus selection signal vector BusOutSel is set to allow the multiplexer 66 to select 4 bits used for the test bus, 4 input-side bits selected by the multiplexer 65 must match 4 output-side bits selected by the multiplexer 66. However, an I/O bus, which is more than 4 bits wide, may also be used as the existing I/O bus. In this case, the 4 input-side bits selected by the multiplexer 65 do not always match the 4 output-side bits selected by the multiplexer 66. This selection is made according to the substitute bus selection signal vectors BusInSel and BusOutSel.

In such a manner, the bypass function of the JTAG can be implemented by the substitute bus 32a of the first embodiment. However, there is a need to determine in advance which input/output terminals are associated with which bits of the substitute bus 32a and whether or not their wiring is to be done. The instruction register (IR) 52 and the ID register 54 are configured so as to perform input and output operations in units of 4 bits.

When the mode switching signal ModeCh received from the TAP control circuit 51 is active ("H"), the extended JTAG mode, which is a unique function of the first embodiment, is activated. In the extended JTAG mode, the multiplexer 63 selects enable data EnData sent from the TAP control circuit 51. The enable data EnData determines whether to output corresponding input/output data to the substitute bus 32a. In the first embodiment, an active ("H") signal composed of 4i (i: integer) consecutive bits is provided. In this case, it is more efficient to perform shifting in the BSPC every 4i bits, rather than every 1 bit. This control is performed by the TAP control circuit 51. Consequently, in the extended JTAG mode, the enable data EnData, which is regular data provided by the TAP control circuit 51, instead of the "actual data", circulates in the BSPC.

In the case where shifting is performed every 4i bits in the BSPC, bits of the substitute bus 32a to which each input/output port supplies its data are previously determined for each input/output port through its wiring. Only specific 4 bits of the substitute bus 32a can be used for every input/output circuit 40 in the case where the enable data EnData is exclusively shifted to prevent collisions on the bus. This indicates actual implementation of the test bus. It should be noted that the m (=4) bits employed in the first embodiment are only an example, and a different number of bits can be equally employed. It should be noted, however, that the number of bits "m" must be an integer greater than 1 and must not exceed the number of bits of the substitute I/O bus.

Figure 3:
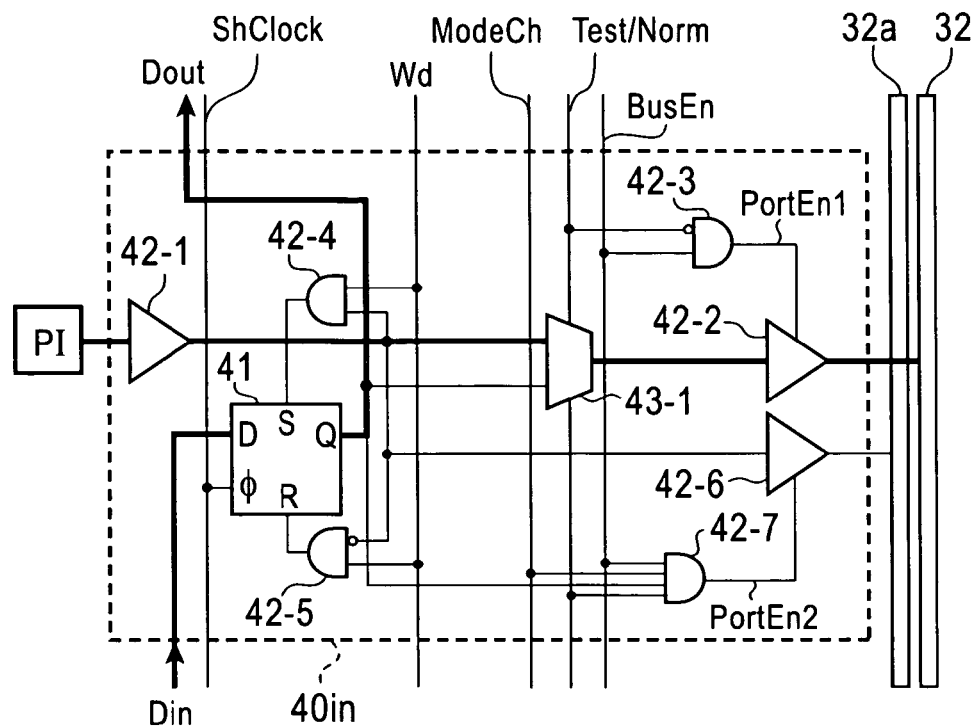
FIG. 3 schematically illustrates an example of an input circuit shown in FIG. 1.

FIG. 3 illustrates an example of the input circuit 40in shown in FIG. 1.

As shown in FIG. 3, the input circuit 40in includes, for example, a first shift register 41, a plurality of gates, and a multiplexer 43-1. The first shift register is a 4-bit shift register which shifts 4 bits of the input data Din flowing in the BSPC and outputs 4-bit output data Dout. In FIG. 3, the first shift register is shown as a 1-bit shift register for ease of illustration. The gates of the input circuit 40in are a buffer 42-1, tri-state buffers 42-2 and 42-6, and AND gates 42-3, 42-4, 42-5, and 42-7. These gates select either input data from the input port PI or output data Dout and sends the selected data to the substitute bus 32a. The shift register 41 includes a clock terminal φ to receive a shift clock ShClock from the TAP control circuit 51, an input terminal D to receive input data Din, an output terminal Q to issue output data Dout, a set terminal S, and a reset terminal R. Based on the shift clock ShClock received through the clock terminal φ, the shift register 41 shifts 4 bits of the input data Din received through the input terminal D and outputs 4-bit output data Dout through the output terminal Q.

The buffer 42-1 is a circuit which drives data received through the input port PI. An output terminal of the buffer 42-1 is connected to a first input terminal of the multiplexer 43-1. The second input terminal of the multiplexer 43-1 is connected to the output terminal Q of the shift register 41. Based on a control signal Test/Norm issued from the TAP control circuit 51, the multiplexer 43-1 selects and outputs either an input signal of its first input terminal or an input signal of its second input terminal. An output terminal of the multiplexer 43-1 is connected to the tri-state buffer 42-2. The tri-state buffer 42-2 is a circuit which is turned on or off depending on a control signal PortEn1 supplied from the AND gate 42-3. The tri-state buffer 42-2 supplies the output signal of the multiplexer 43-1 to the substitute bus 32a when it is turned on. The AND gate 42-3 is a circuit which obtains a logical product of an inverted signal of the control signal Test/Norm supplied from the TAP control circuit 51 and an output enable signal BusEn supplied from the TAP control circuit 51, and provides the control signal PortEn1 to the tri-state buffer 42-2.

Both the output terminal of the buffer 42-1 and a signal line of a data write signal Wd supplied from the TAP control circuit 51 are connected to input terminals of the AND gate 42-4, and an output terminal of the AND gate 42-4 is connected to a set terminal S of the shift register 41. Both an inverter for inverting an output signal of the buffer 42-1 and the signal line of the data write signal Wd supplied from the TAP control circuit 51 are connected to input terminals of the AND gate 42-5, and an output terminal of the AND gate 42-5 is connected to a reset terminal R of the shift register 41. In addition, the output terminal of the buffer 42-1 is connected to an input terminal of the tri-state buffer 42-6. The tri-state buffer 42-6 is a circuit which is turned on or off depending on a control signal PortEn2 supplied from the AND gate 42-7. The tri-state buffer 42-6 supplies the output signal of the buffer 42-1 to the substitute bus 32a when it is turned on. The AND gate 42-7 is a circuit which obtains a logical product of an output signal from the output terminal Q of the shift register 41 and control signals ModeCh, Test/Norm, and BusEn supplied from the TAP control circuit 51, and provides the control signal PortEn2 to the tri-state buffer 42-6.

In the input circuit 40in shown in FIG. 3, the unique function (i.e., the enhanced JTAG spec) of the first embodiment is implemented by the tri-state buffer 42-6 and the AND gate 42-7.

In normal operation, the control signal Test/Norm supplied from the TAP control circuit 51 is inactive ("L"), and the multiplexer 43-1 selects the output of the buffer 42-1. If the control signal Test/Norm supplied from the TAP control circuit 51 is inactive and the output enable signal BusEn is active, the AND gate 42-3 activates the control signal PortEn1. Accordingly, the input data received from the input port PI is sent to the substitute bus 32a via the buffer 42-1, the multiplexer 43-1, and the tri-state buffer 42-2 when this data is used for another process.

A description will now be given of the JTAG test operation of the input circuit 40in of FIG. 3 where the substitute bus 32a functions as the normal I/O bus 32.

In the test operation, the control signal Test/Norm supplied from the TAP control circuit 51 is activated ("H"), and the multiplexer 43-1 selects the output terminal Q of the shift register 41. In the JTAG, the input circuit 40in is used in such a manner that initial setting data, rather than actual input data from the input port PI, is loaded into the shift register 41 via the BSPC of the shift register 41 at initial setting of the test operation, and the data is sent as input data to the substitute bus 32a during the test operation.

For example, in FIG. 3, it is assumed that the control signal Test/Norm sent from the TAP control circuit 51 is activated (H) to select the conventional JTAG operation, and initial setting data has already been loaded in the shift register 41 during the test operation. In this case, the initial setting data held in the shift register 41 is output from its output terminal Q to the substitute bus 32a via the multiplexer 43-1 and the tn-state buffer 42-2. This output is made when the control signal PortEn1 of the tn-state buffer 42-2 is active. Accordingly, input data can be sent to the substitute bus 32a in response to the output enable signal BusEn, exactly at the same time as corresponding input data in normal operation. The output enable signal BusEn triggers the outputting to the substitute bus 32a.

A method for outputting a value of the input port PI to the outside upon completion of the test operation of the JTAG will now be described with reference to FIG. 3.

Although the shift register 41 forms the BSPC according to the JTAG, it is shown as a 1-bit shift register in FIG. 3. Input data Din carried in the BSPC is input through the input terminal D of the shift register 41, and output data Dout is output through the output terminal Q thereof. In the first embodiment, the input data Din is loaded into the shift register 41 using the set/reset function of the shift register 41. Specifically, if a data write signal Wd generated from the TAP control circuit 51 is active ("H"), either the AND gate 42-4 connected to a set terminal S of the shift register 41 or the AND gate 42-5 connected to a reset terminal R thereof is active depending on the value of the output signal of the buffer 42-1. Accordingly, the value of the output signal of the buffer 42-1 is transferred, without alteration, to the shift register 41, the input data Din is maintained in the shift register 41, and an output signal Dout is issued through the output terminal Q of the shift register 41.

If a data shifting mode is selected in the TAP control circuit 51 so that a clock signal for data shifting ShClock is generated from the TAP control circuit 51, the input data Din loaded into the shift register 41 is shifted along the BSPC. Values of all the input and output circuits 40 are sequentially output from the terminal TDOV (FIG. 1) in response to the shift clock ShClock.

A description will now be given, with reference to FIG. 3, of how the input/output data is output to the outside according to a method unique to the first embodiment.

In this operation, the signal Test/Norm is active and the multiplexer 43-1 selects the output terminal Q of the shift register 41. The specific initial setting data loaded into the shift register 41 is enable data rather than actual data. When the enable data is output, the control signal PortEn2 of the tri-state buffer 42-6, which is output from the AND gate 42-7, is activated. Accordingly, input data from the input port PI is output to the substitute bus 32a via the buffer 42-1 and the tri-state buffer 42-6. On the contrary, when the enable data is not output, the control signal PortEn2 of the tri-state buffer 42-6 is deactivated so that the input data from the input port PI is prevented from being output to the substitute bus 32a and the input data of the input port PI enters an output wait state in which the input data awaits output.

If the enable data is data having 4 active bits and having no active bit prior to and subsequent to the 4 active bits and the shift register 41 is also shifted every 4 bits, the enable data can refer to the input and output terminals every 4 bits. That is, with each shift, data corresponding to four terminals of the input and output ports is sequentially output to the 4-bit substitute bus 32a, so that it is possible to refer to all terminals composed of 100 or more pins. Here, there is an advantage in that the data output rate can be increased four-fold if 4 bits are shifted per clock.

Figure 4:
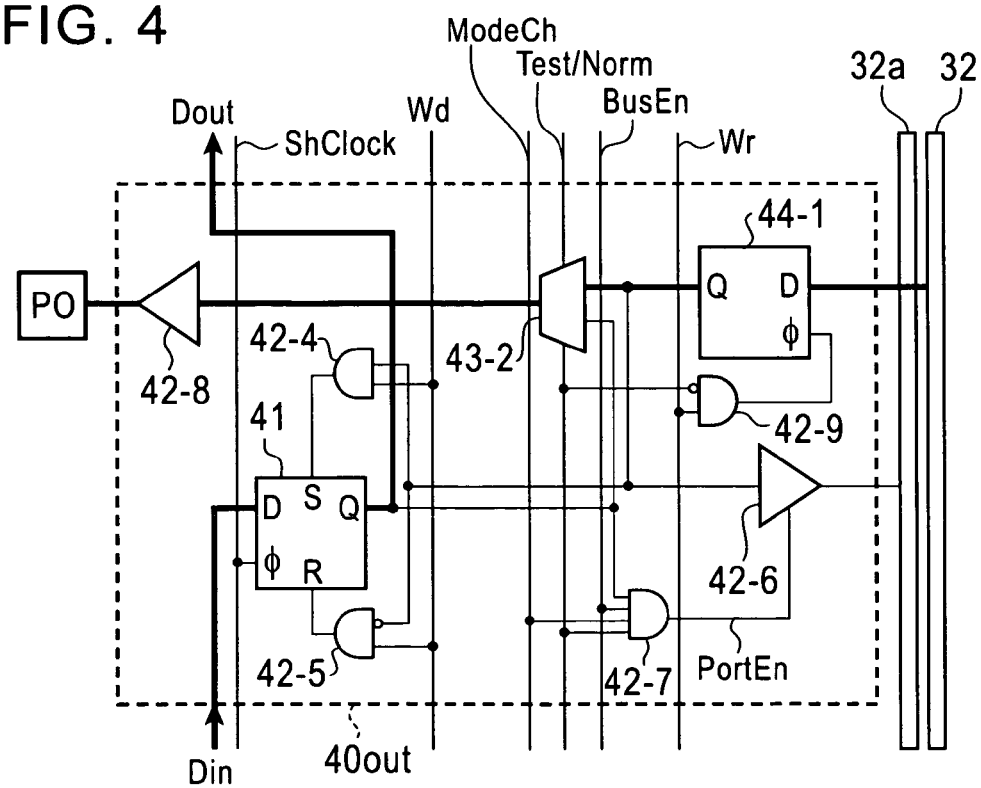
FIG. 4 schematically illustrates an example of an output circuit shown in FIG. 1.

FIG. 4 illustrates an example of the output circuit 40out shown in FIG. 1. The same elements as those of the input circuit 40in shown in FIG. 3 are denoted by the same reference numerals.

As shown in FIG. 4, the output circuit 40out includes, for example, a second shift register 41, a plurality of gates, a multiplexer 43-2, and an output register 44-1. The second shift register 41 is a 4-bit shift register which shifts 4 bits of the input data Din flowing in the BSPC and outputs 4-bit output data Dout. In FIG. 4, the second shift register 41 is shown as a 1-bit shift register for ease of illustration. The gates of the output circuit 40out are AND gates 42-4, 42-5, 42-7, and 42-9, a tri-state buffer 42-6, and an output buffer 42-8. These gates select either data supplied from the substitute bus 32a or output data Dout and outputs the selected data to the output port PO. Based on the shift clock ShClock received through its clock terminal φ, the shift register 41 shifts 4 bits of the input data Din received through the input terminal D and outputs 4-bit output data Dout through its output terminal Q.

The output register 44-1 is a circuit which includes an input terminal D through which data of the substitute bus 32a is input, a clock terminal φ through which an output signal of the AND gate 42-9 is input, and an output terminal Q through which data is output. Based on the output signal of the AND gate 42-9, which is received through the clock terminal φ, the output register 44-1 latches a signal of the substitute bus 32a and outputs the latched signal through the output terminal Q. The AND gate 42-9 is a circuit which obtains a logical product of an inverted signal of a control signal Test/Norm sent from the TAP control circuit 51 and a data write signal Wr sent from the TAP control circuit 51, and provides the logical product to the clock terminal φ of the output register 44-1. The output terminal Q of the output register 44-1 and the output terminal Q of the shift register 41 are connected to input terminals of the multiplexer 43-2. The multiplexer 43-2 is a circuit which selects and outputs either an output signal of the output register 44-1 or an output signal of the shift register 41 based on a control signal Test/Norm supplied from the TAP control circuit 51. An output terminal of the multiplexer 43-2 is connected to the output port PO via the output buffer 42-8.

The output terminal Q of the output register 44-1 and a signal line of the data write signal Wd supplied from the TAP control circuit 51 are connected to the set terminal S of the shift register 41 via the AND gate 42-4. An inverter connected to the output terminal Q of the output register 44-1 and a signal line of the data write signal Wd supplied from the TAP control circuit 51 are connected to the reset terminal R of the shift register 41 via the AND gate 42-5.

The AND gate 42-7 obtains a logical product of the output signal of the shift register 41 and the control signals ModeCh, Test/Norm and BusEn supplied from the TAP control circuit 51, and provides a corresponding logical product signal PortEn to the tri-state buffer 42-6. The tri-state buffer 42-6 is a circuit which is turned on/off based on the signal PortEn, and feeds an output signal of the output register 44-1 to the substitute bus 32a when it is turned on.

In such a manner, the function unique to the first embodiment can also be added to the output port PO of the output circuit 40out. The unique function (i.e., the extended JTAG spec) of the first embodiment is implemented by the tri-state buffer 42-6 and the AND gate 42-7.

In FIG. 4, the conventional function of the output port PO is implemented via the output register 44-1, the multiplexer 43-2, and the buffer 42-8. Since the device is in normal operation, the signal Test/Norm supplied from the TAP control circuit 41 is inactive ("L"), and the AND gate 42-9 is ready to receive a write signal Wr from the TAP control circuit 41. Accordingly, data of the substitute bus 32a is written to the output register 44-1 in response to the write signal Wr.

During the JTAG test operation, this data is only referred to by the output port PO and is not transmitted to the substitute bus 32a. On the other hand, since there is a need to provide the data to an external device connected to the output port PO, there is a need to perform initial setting therefor. Accordingly, a process for loading initial setting data rather than actual input data into the shift register 41 through the BSPC of the shift register 41 is performed during initial setting in the test operation. Instead of the output of the output register 44-1, the loaded output data Din is sent to the output port PO via the output terminal Q of the shift register 41, the multiplexer 43-2, and the buffer 42-8. The output of the output register 44-1 is maintained during this procedure.

After the test operation is completed, the data appearing on the output terminal Q of the output register 44-1 is loaded into the shift register 41 by the write signal Wd, and the AND gates 42-4 and 42-5. The loaded data is sent to the outside using the BSPC of the shift register 41 according to the shift clock ShClock.

A description will now be given, with reference to FIG. 4, of how the output data is output to the outside according to the method unique to the first embodiment.

A process for loading initial setting data into the shift register 41 through the BSPC of the shift register 41 is performed in the same manner as described above. After the test is completed, specific data is loaded into the shift register 41. This specific data is enable data rather than actual data. If an enable signal PortEn is output from the AND gate 42-7, an output signal from the output terminal Q of the output register 44-1 is provided to the substitute bus 32a through the tri-state buffer 42-6. The outputting of the enable signal PortEn is made at the same time as the outputting of an output enable signal BusEn to the substitute bus 32a. On the contrary, when the enable signal PortEn is not output from the AND gate 42-7, the input data is prevented from being output, and the data of the input port PI enters an output wait state in which the data awaits output. Thus, if enable data is employed, the output data can be referred to at the terminal TDIV via the substitute bus 32a.

Figure 5:
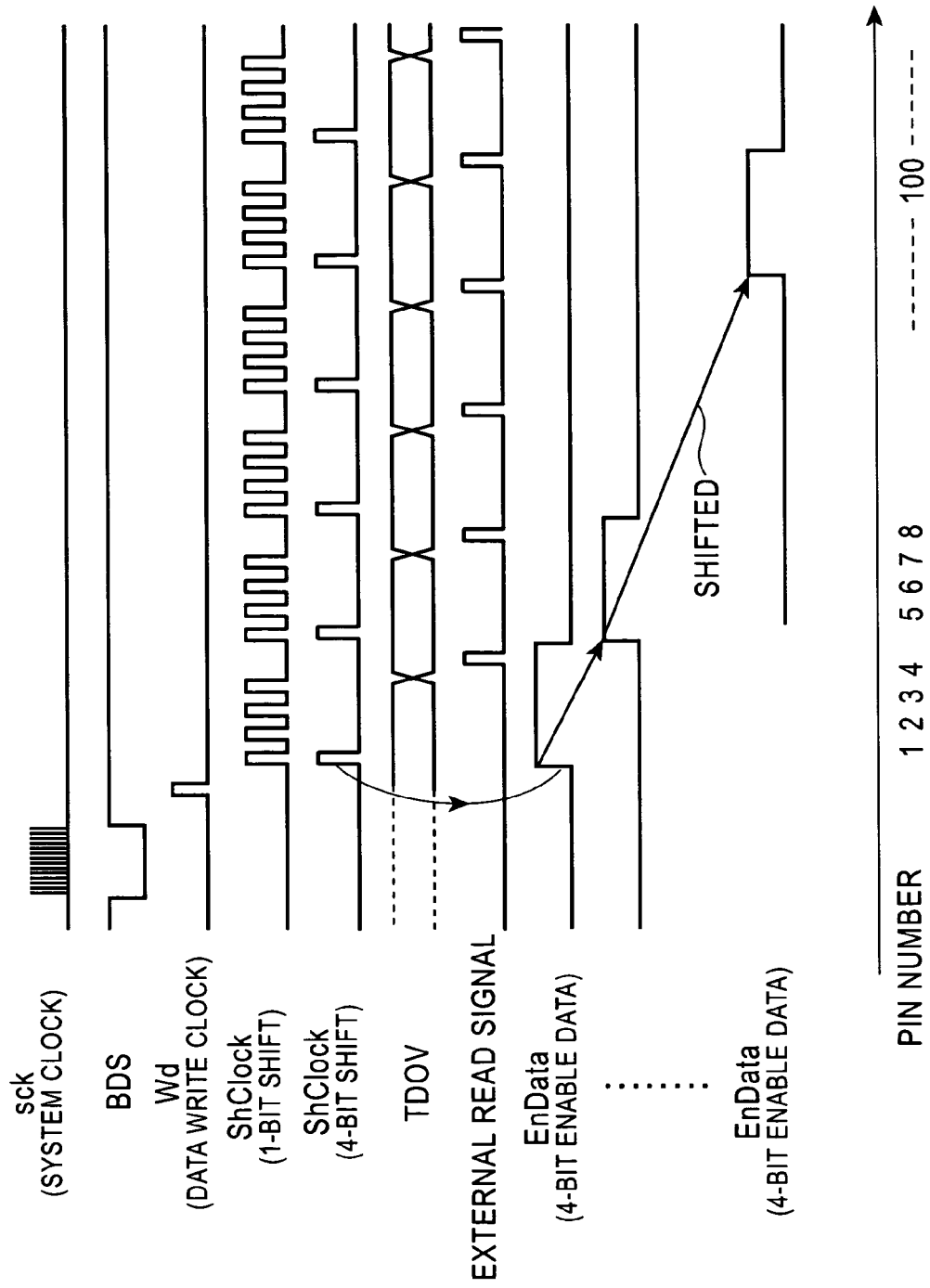
FIG. 5 is a diagram illustrating the timing of reading the input and output data in FIG. 1.

FIG. 5 illustrates the timing of reading the input and output data in FIG. 1.

The operation timing of the input circuit 40in and the output circuit 40out in FIG. 1 will now be described with reference to FIG. 5.

In FIG. 5, a system clock sck such as a CPU clock for the device 30 of FIG. 1 is provided during the JTAG test operation. In this example, a JTAG interface specifies its input and the system clock sck is provided every state or every machine cycle, after which output data is referred to via the JTAG interface. While the system clock sck is provided, the signal ModeCh is inactive, and the substitute bus 32a can be used normally. The process for outputting the input and output data to the outside according to the method unique to the first embodiment is performed when the signal ModeCh is activated after the system clock sck is stopped.

Initially, a data write clock Wd is output from the TAP control circuit 51. This data write operation is performed for the purpose of loading the input/output data (i.e., test result) into the shift register 41. Generally, after the JTAG test operation is completed, the input data does not match the value set during the initial setting. Here, the output data indicates the test result.

Next, 4 shift clocks ShClock are provided to the shift register 41 in order to feed the input and output data to the outside. The enable data EnData has 4 consecutive active bits "H" for specifying 4 terminals associated with the test. When the shift register 41 employs 4-bit shift rather than 1-bit shift as described above in the first embodiment, one shift clock ShClock is enough for the shift register 41. Accordingly, the 4-bit substitute bus 32a transmits the input and output data to the terminal TDOV via the multiplexer 66, and the input and output data constitutes a TDOV signal. The TDOV signal shown in FIG. 5 updates its data in synchronization with the shift clock ShClock. The TDOV signal is only partly shown in FIG. 5, and the remaining part of the TDOV signal has the same waveform as that shown in FIG. 5. The TDOV signal is read according to a read signal from a JTAG control circuit (not shown) installed outside the device 30. However, the read signal can also be generated by a synthesizing process based on the TCK signal.

If the 4-bit enable data EnData is data having consecutive active bits and having no active bit prior to and subsequent to the enable data, and the shift register 41 is shifted every 4 bits, then the enable data EnData can refer to the input and output terminals every 4 bits. In FIG. 5, this is expressed as shift of the 4-bit active data EnData. In a device 30 having 100 or more pins, if the pins receive the 4-bit active data in pin number order, for example, in increasing distance order from the terminal TDI, then the input and output data is referred to as a 4-bit TDIV signal and the test result of the prescribed input and output states is determined.

FIG. 6 illustrates the comparison between expected outputs of the input port PI (i.e., the flows of data from the input port PI) in the conventional JTAG and in the enhanced JTAG according to the first embodiment.

The conventional JTAG spec (ModeCh=0) will be described first. In normal operation (Test/Norm=0), an input value from the input port PI is sent to an I/O bus (corresponding to the substitute bus 32a in the first embodiment) via an input buffer (corresponding to the buffer 42-1 in FIG. 3). In initial setting of the test operation (Test/Norm=1), a register value (corresponding to the output data Dout output from the output terminal Q of the shift register 41), which is an input value Din loaded into the shift register through the BSPC, is sent to the I/O bus (corresponding to the substitute bus 32a in the first embodiment). After the test operation (Test/Norm=1) is completed, the register value (corresponding to the output data Dout supplied from the output terminal Q of the shift register 41), which is an input value loaded from the input port PI via the input buffer (corresponding to the buffer 42-1 in FIG. 3), is shifted along the BSPC.

On the other hand, in the normal operation (Test/Norm=0) of the extended JTAG spec of the first embodiment (ModeCh=1), an input value from the input port PI is sent to the substitute bus 32a via the buffer 42-1. In initial setting of the test operation (Test/Norm=1), a register value (i.e., the output data Dout supplied from the output terminal Q of the shift register 41), which is an input value Din loaded into the shift register through the BSPC, is issued to the substitute bus 32a. After the test operation (Test/Norm=1) is completed, it is possible to select either or both of an operation according to the JTAG spec in which the register value (i.e., the output data Dout supplied from the output terminal Q of the shift register 41), which is an input value loaded from the input port PI, is shifted along the BSPC and an operation according to the extended JTAG spec in which the input value loaded from the input port PI via the buffer 42-1 is output to the substitute bus 32a. This is because, in the test operation, a shift clock ShClock or a write signal Wd or an output enable signal (for example, a bus enable signal BusEn) can be separately output by the TAP control circuit 51.

In the test operation of the conventional JTAG, data on the output port PO is only referred to and is not output to the I/O bus (corresponding to the substitute bus 32a in the first embodiment). Although not employed in the first embodiment, if the control signal PortEn2 of FIG. 3 is activated, it is possible to output the input value to the substitute bus 32a via the buffer 42-1 even in the JTAG test operation (ModeCh=0 and Test/Norm=1). The conventional JTAG does not have this feature. This feature increases the degree of freedom in the test of the device 30.

FIG. 7 illustrates the comparison between expected outputs of the output port PO in the conventional JTAG and in the enhanced JTAG according to the first embodiment.

In the normal operation (Test/Norm=0) of the conventional JTAG spec (ModeCh=0), an output value (corresponding to a value on the output terminal Q of the output register 44-1 in FIG. 4) from an I/O bus (corresponding to the substitute bus 32a in the first embodiment), which has been written to an output register (corresponding to the output register 44-1 in FIG. 4), is output to the output port PO. In initial setting of the test operation (Test/Norm=1), a register value (corresponding to the output data Dout supplied from the output terminal Q of the shift register 41), which is an output value Dout loaded into the shift register through the BSPC, is sent to the output port PO. After the test operation (Test/Norm=1) is completed, the register value (corresponding to the output data Dout supplied from the output terminal Q of the shift register 41 in FIG. 4), which is a loaded value of the output value written to the output register (corresponding to the output register 44-1 in FIG. 4), is shifted along the BSPC.

On the other hand, in the normal operation (Test/Norm=0) of the extended JTAG spec of the first embodiment (ModeCh=1), an output value from the substitute bus 32a, which is written to the output register 44-1, is sent to the output port PO. In initial setting of the test operation (Test/Norm=1), a register value (i.e., the output data Dout supplied from the output terminal Q of the shift register 41), which is an output value loaded into the shift register through the BSPC, is supplied to the output port PO. After the test operation (Test/Norm=1) is completed, it is possible to select either or both of an operation according to the JTAG spec in which the register value (i.e., the output data Dout supplied from the output terminal Q of the shift register 41), which is a loaded value of the output value from the output register 44-1, is shifted along the BSPC and an operation according to the extended JTAG spec in which the output value of the output register 44-1 is sent to the substitute bus 32a. This is because, in the test operation, a shift clock ShClock or a write signal Wd or Wr or an output enable signal (for example, a bus enable signal BusEn) can be separately output by the TAP control circuit 51.

The first embodiment of the present invention has the following advantages (a) to (c).

(a) Since an m-bit test bus is in effect created using the existing I/O bus 32, the speed of reading input/output data can be increased m-fold using a shift clock provided for shifting m bits per clock while preventing an increase in the volume (size) of the test circuitry.

(b) A function to output the output data Do loaded into the shift register 41 to the test bus can be added to the output circuit 40out. A new test bus can be in effect provided while maintaining the conventional JTAG function. Thus, the test system is also of practical use in extending the JTAG features. Accordingly, it is possible to more easily test devices such as built-in devices, PCBs and integrated circuits, which have a large number of pins and have a complicated configuration.

(c) Although the existing I/O bus 32 is used to save the resources in the first embodiment, a separate test bus can also be introduced if there is a surplus area on integrated circuits.

Second Embodiment

Figure 8:
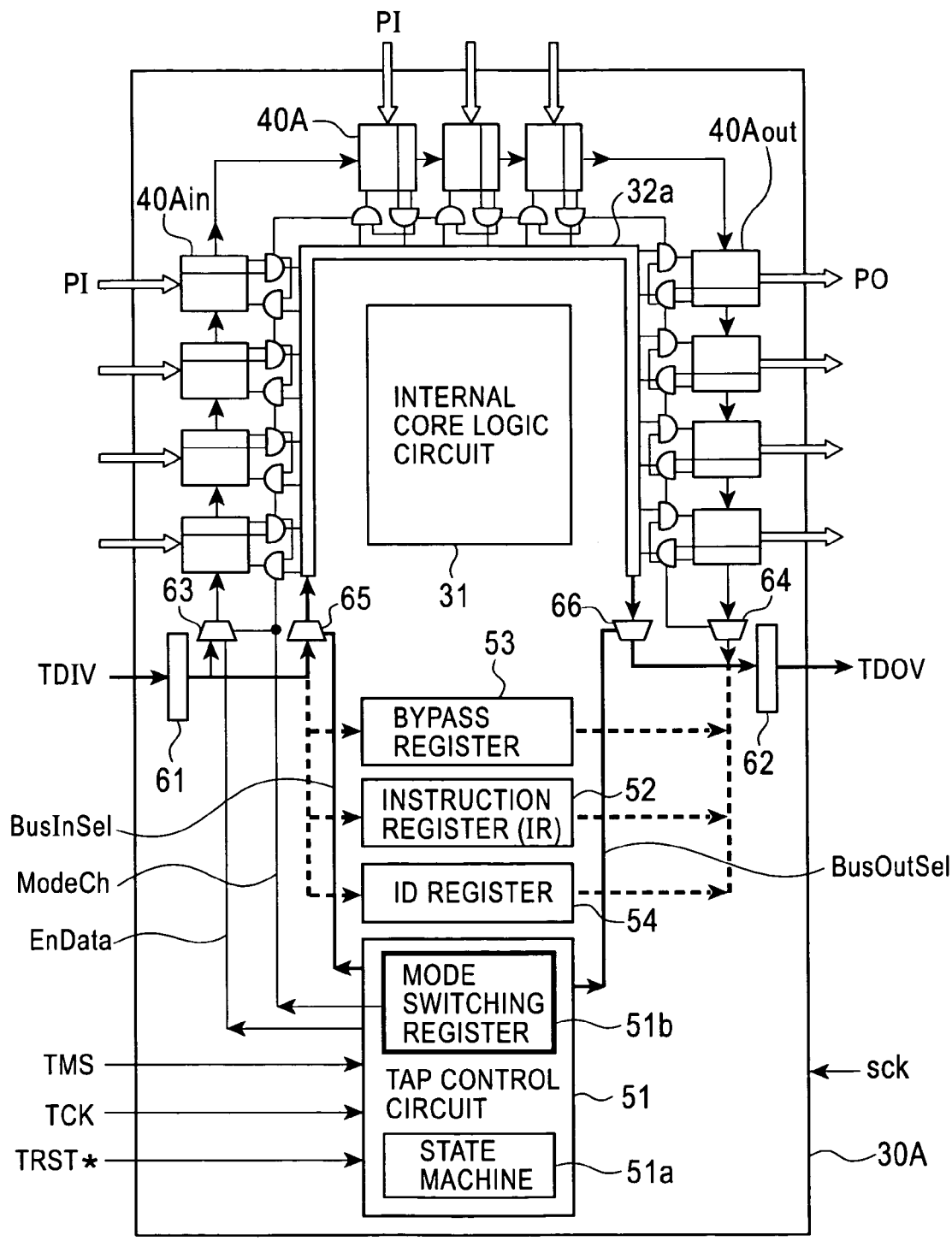
FIG. 8 schematically shows a test system according to a second embodiment of the present invention.

Referring to FIG. 8, a test system according to a second embodiment of the present invention will be described. Similar elements in the first and second embodiments are denoted by the same reference numerals.

The second embodiment employs a more advanced method of using the substitute bus 32a as a test bus. In the first embodiment, input and output data is only output to the substitute bus 32a. In the second embodiment, however, input and output data can also be input from the substitute bus 32a. This eliminates the need to perform the process of circulating the input and output data in the BSPC for initial setting of input and output circuits 40A connected to the input and output ports PI and PO, and also makes it possible to perform the test at higher speed. The enable data is only circulated in the BSPC.

A device 30A according to the second embodiment has almost the same configuration as the device 30 according to the first embodiment. However, the device 30A according to the second embodiment differs from the device 30 according to the first embodiment in that each of a plurality of input and output circuits 40A, which includes a plurality of input circuits 40Ain and a plurality of output circuits 40Aout connected in series to constitute a BSPC, has I/O gates for the substitute bus 32a. The I/O gates include input gates and output gates, each of which is configured so as to input/output data from/to the substitute bus 32a only if a mode switching register 51b in a TAP control circuit 51 selects an extended JTAG mode and thus a mode switching signal ModeCh supplied from the mode switching register 51b is active. Specifically, an output gate provided in each of the input and output circuits 40A receives both of a data output signal and the mode switching signal ModeCh supplied from the mode switching register 51b in the TAP control circuit 51. Likewise, an input gate provided in each of the input and output circuits 40A receives both of the data input signal and the mode switching signal ModeCh given from the mode switching register 51b. Further, every input gate and every output gate includes a register for maintaining enable data EnData given from the TAP control circuit 51 and can access only input/output terminals, selected by the enable data EnData, of the substitute bus 32a.

Figure 9:
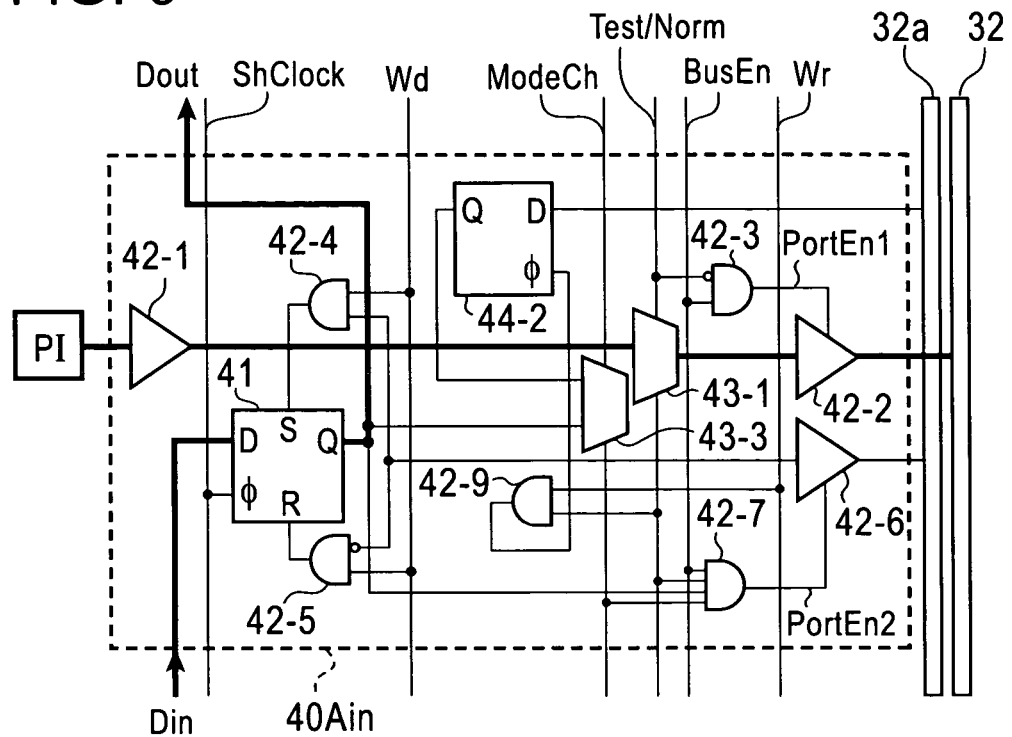
FIG. 9 is a schematic diagram of an exemplary input circuit shown in FIG. 8.

FIG. 9 illustrates an example of the input circuit 40Ain shown in FIG. 8. The same elements as those of the first embodiment shown in FIG. 3 are denoted by the same reference numerals.

The input circuit 40Ain differs from the input circuit 40in of FIG. 3 in that the input circuit 40Ain includes an AND gate 42-9, a multiplexer 43-3, and a first input register 44-2, in addition to the elements of the input circuit 40in of FIG. 3, so that the input circuit 40Ain can receive an input from the substitute bus 32a.

The AND gate 42-9 is a circuit which obtains a logical product of signals Wr and Test/Norm supplied from the TAP control circuit 51. An output terminal of the AND gate 42-9 is connected to a clock terminal φ of the input register 44-2. The input register 44-2 is a circuit which receives data on the substitute bus 32a at the input terminal D based on the logical product received through the clock terminal φ from the AND gate 42-9, and stores this data. The input register 44-2 also outputs the stored data through an output terminal Q. The output terminal Q of the input register 44-2 and an output terminal Q of the first shift register 41 are connected to input terminals of the multiplexer 43-3. The multiplexer 43-3 is a circuit which selects and outputs either an output signal of the input register 44-2 or an output signal of the shift register 41 based on a mode switching signal ModeCh supplied from the mode switching register 51b in the TAP control circuit 51. An output terminal of the multiplexer 43-3 is connected to one input terminal of the multiplexer 43-1.

A function (i.e., the extended JTAG spec) unique to the second embodiment is implemented by the multiplexer 43-3, the input register 44-2, the buffer 42-6, and the AND gates 42-7 and 42-9. In the input circuit 40in of FIG. 3 according to the first embodiment, an output signal from the output terminal Q of the shift register 41 is directly introduced to the test-side input terminal of the multiplexer 43-1 during the test operation (Test/Norm=1). In the second embodiment, however, the multiplexer 43-3 is additionally provided, which selects an input from the substitute bus 32a based on a mode switching signal ModeCh as its selection signal when the device operates in a mode unique to the second embodiment. Accordingly, in initial setting of the input port PI, initial data from the substitute bus 32a can be set by the input register 44-2 without passing through the BSPC.

Figure 10:
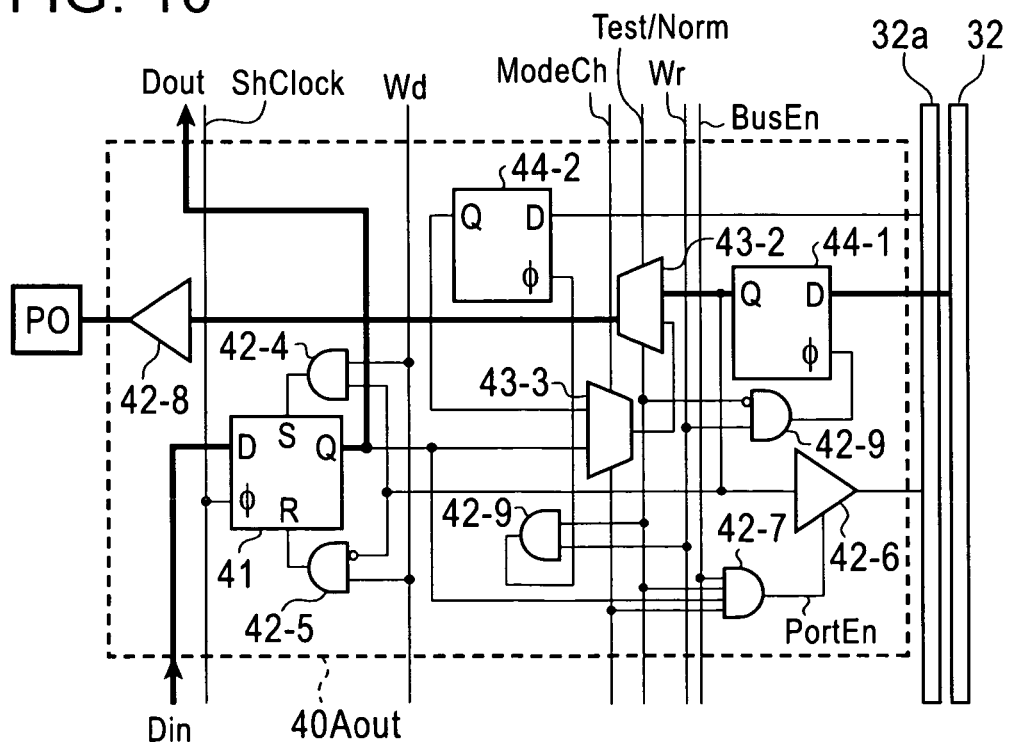
FIG. 10 is a schematic diagram of an exemplary output circuit shown in FIG. 8.
Figure 13:
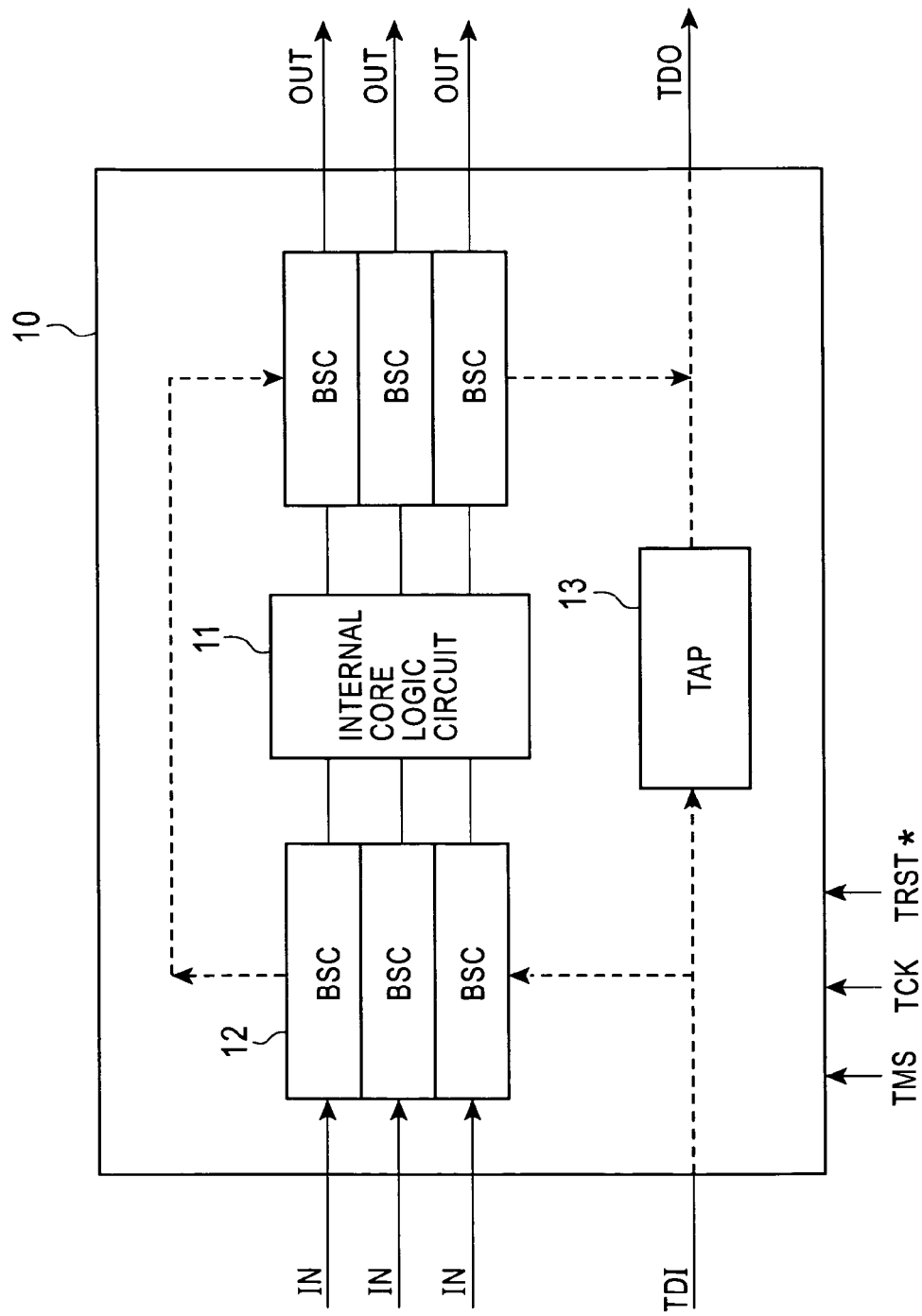
FIG. 13 is a conceptual diagram illustrating the architecture of a device including an integrated circuit on which the conventional test system is provided.
Figure 14:
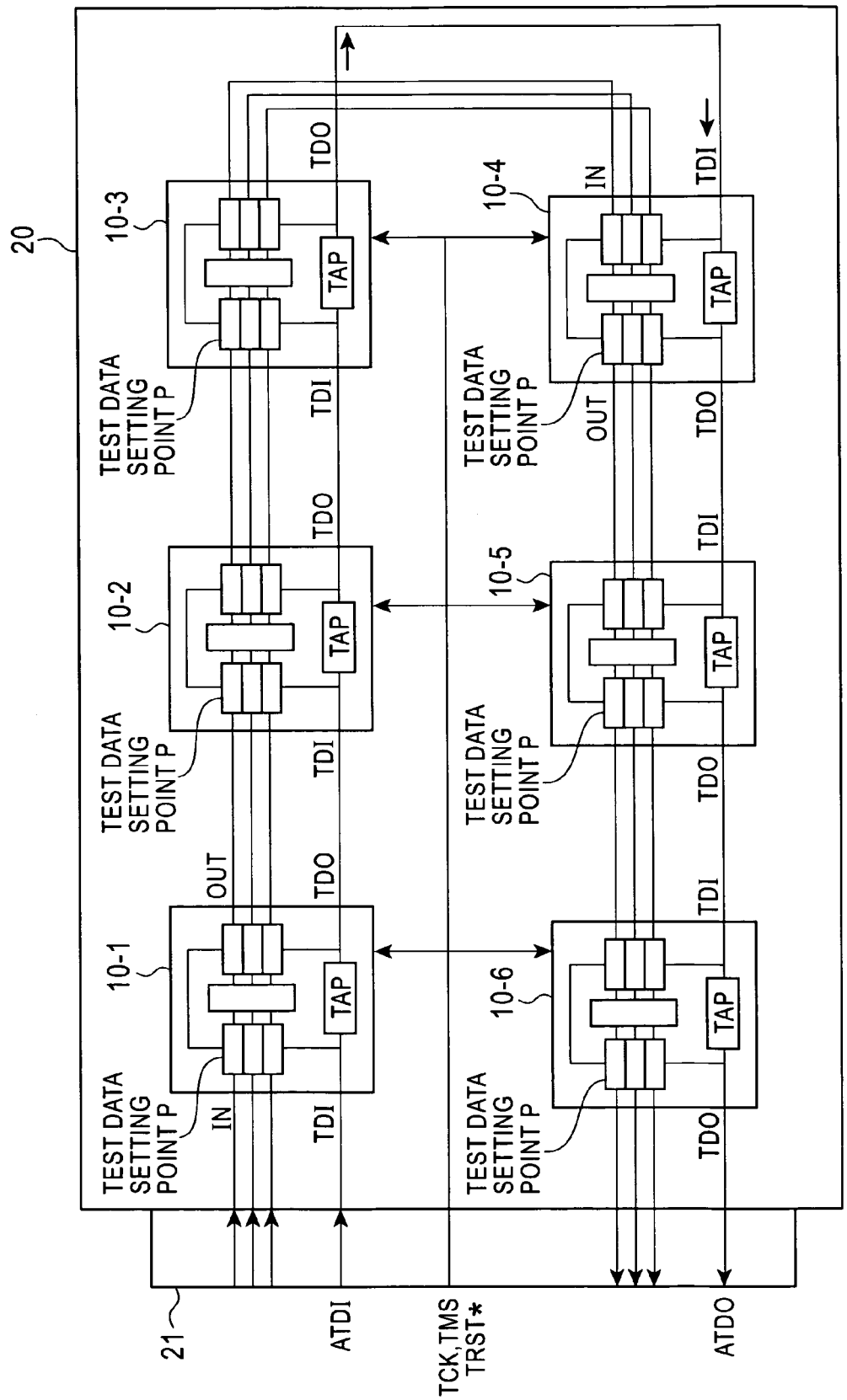
FIG. 14 is a schematic diagram illustrating the configuration of a boundary scan circuit on which a plurality of the devices of FIG. 13 is provided.

FIG. 10 illustrates an example of the output circuit 40Aout shown in FIG. 8. The same elements as those of the first embodiment shown in FIG. 4 are denoted by the same reference numerals.

The output circuit 40Aout differs from the output circuit 40out of FIG. 4 in that the output circuit 40Aout includes an AND gate 42-9, a multiplexer 43-4, and a second input register 44-2, in addition to the elements of the output circuit 40out of FIG. 3, so that the output circuit 40Aout can receive an input from the substitute bus 32a.

The AND gate 42-9 is a circuit which obtains a logical product of signals Wr and Test/Norm supplied from the TAP control circuit 51. An output terminal of the AND gate 42-9 is connected to a clock terminal φ of the input register 44-2. The input register 44-2 is a circuit which receives data on the substitute bus 32a at the input terminal D, and stores this data, based on the logical product received through the clock terminal φ from the AND gate 42-9. The input register 44-2 also outputs the stored data through an output terminal Q. The output terminal Q of the input register 44-2 and an output terminal Q of a second shift register 41 are connected to input terminals of the multiplexer 43-3. The multiplexer 43-3 is a circuit which selects and outputs either an output signal of the input register 44-2 or an output signal of the shift register 41 based on a mode switching signal ModeCh obtained from the mode switching register 51b in the TAP control circuit 51. An output terminal of the multiplexer 43-3 is connected to one input terminal of the multiplexer 43-2.

A function (i.e., the extended JTAG spec) unique to the second embodiment is implemented by the multiplexer 43-3, the input register 44-2, the buffer 42-6, and the AND gates 42-7 and 42-9. In the output circuit 40out of FIG. 4 according to the first embodiment, an output signal from the output terminal Q of the shift register 41 is directly introduced to the test-side input terminal of the multiplexer 43-2 in the test operation (Test/Norm=1). In the second embodiment, however, the multiplexer 43-3 is additionally provided, which selects an input from the substitute bus 32a based on a mode switching signal ModeCh as its selection signal when the device operates in a mode unique to the second embodiment. Accordingly, in initial setting of the output port PO, initial data from the substitute bus 32a can be set by the input register 44-2 without passing through the BSPC.

FIG. 11 illustrates the comparison between expected outputs of the input port PI (i.e., the flows of data from the input port PI) in the conventional JTAG and in the enhanced JTAG according to the second embodiment.

In normal operation (Test/Norm=0) of the conventional JTAG spec (ModeCh=0), an input value from the input port PI (corresponding to an input value of the buffer 42-1 in FIG. 9) is output to an I/O bus (corresponding to the substitute bus 32a in FIG. 9). In initial setting of the test operation (Test/Norm=1), a register value (corresponding to the output signal of the shift register 41 in FIG. 9), which is an input value loaded into the shift register through the BSPC, is output to the I/O bus (corresponding to the substitute bus 32a). After the test operation (Test/Norm=1) is completed, the register value (corresponding to the output signal of the shift register 41), which is an input value loaded from the input port PI via the gate (corresponding to the buffer 42-1), is shifted along the BSPC.

On the other hand, in normal operation (Test/Norm=0) of the extended JTAG spec of the second embodiment (ModeCh=1), an input value from the input port PI is output to the substitute bus 32a. In initial setting of the test operation (Test/Norm=1), a register value (corresponding to the output signal of the input register 44-2), which is an input value Din loaded from the substitute 32a, is output to the substitute bus 32a. After the test operation (Test/Norm=1) is completed, it is possible to select either or both of an operation according to the JTAG spec in which the register value (the output signal of the shift register 41), which is an input value loaded from the input port PI, is shifted along the BSPC and an operation according to the extended JTAG spec in which the input value loaded from the input port PI via the buffer 42-1 is output to the substitute bus 32a. This is because, in the test operation, a shift clock ShClock or a write signal Wd or an output enable signal (for example, a bus enable signal BusEn) can be separately output by the TAP control circuit 51.

FIG. 12 illustrates the comparison between expected outputs of the output port PO in the conventional JTAG and in the enhanced JTAG according to the second embodiment.

In the case of the conventional JTAG spec (ModeCh=0), in normal operation (Test/Norm=0), an output value (corresponding to the output signal of the output register 44-1 in FIG. 10) from an I/O bus (corresponding to the substitute bus 32a in FIG. 10), which has been written to an output register, is output to the output port PO. In initial setting of the test operation (Test/Norm=1), a register value (corresponding to the output signal of the shift register 41 in FIG. 10), which is an output value Dout loaded into the shift register through the BSPC, is output to the output port PO. After the test operation (Test/Norm=1) is completed, the register value (corresponding to the output signal of the shift register 41), which is a loaded value from the output register (corresponding to the output register 44-1), is shifted along the BSPC.

On the other hand, in the case of the extended JTAG spec of the second embodiment (ModeCh=1), in normal operation (Test/Norm=0), an output value from the substitute bus 32a, which is written to the output register 44-1, is sent to the output port PO. In initial setting of the test operation (Test/Norm=1), a register value (the output signal of the input register 44-2), which is an output value loaded from the substitute bus 32a, is sent to the output port PO. After the test operation (Test/Norm=1) is completed, it is possible to select either or both of an operation according to the JTAG spec in which the register value (the output signal of the shift register 41), which is a loaded value of the output value from the output register 44-1, is shifted along the BSPC and an operation according to the extended JTAG spec in which the output signal of the output register 44-1 is sent to the substitute bus 32a. This is because, in the test operation, a shift clock ShClock or a write signal Wd or Wr or an output enable signal (for example, a bus enable signal BusEn) can be separately output by the TAP control circuit 51.

In the second embodiment, initial setting of the input and output ports PI and PO can be performed from the substitute bus 32a, so that initial setting through the BSPC is not necessarily performed. In the first embodiment, even when the input and output circuits 40A are reset before the test is initiated, there is a need to perform initial setting of enable data through the BSPC thereafter in order to specify target input and output ports PI and PO. However, in the second embodiment, since data can be input from the substitute bus 32a to the input register 44-2, it is possible to perform initial setting of enable data by specifying corresponding I/O addresses during the test and also to read test results after the test.

The second embodiment has the following advantages.

(a) A more enhanced use of the substitute bus 32a as the test bus is provided. Specifically, the input and output data can be input from the substitute bus 32a. Accordingly, although the volume of the circuit is increased, it is possible to perform initial setting of the input and output circuits 40A, and also to read input/output data directly from the specified input and output circuits 40A. This significantly increases the degree of freedom in the test.

(b) As in the first embodiment, since an m-bit test bus is in effect created using the existing I/O bus 32, the speed of reading input/output data can be increased m-fold using a shift clock provided for shifting m bits per clock.

Third Embodiment

The present invention is not limited to the first and second embodiments, and various changes and modifications are possible without departing from the scope and spirit of the present invention. For example, a third embodiment of the present invention can be provided by modifying the above embodiments as follows.

(1) The internal core logic circuit 31 shown in FIG. 1 and FIG. 8 may be a test target system having a different circuit arrangement.

(2) The input circuits 40in and 40Ain and the output circuits 40out and 40Aout shown in FIG. 1 and FIG. 8 may have different circuit arrangements from those shown in FIG. 3, FIG. 4, FIG. 9 and FIG. 10. Similarly, the TAP may have a different circuit arrangement from those shown in FIG. 1 and FIG. 8.

This application is based on a Japanese Patent Application No. 2005-2553 filed on Jan. 7, 2005 and the entire disclosure thereof is incorporated herein by reference.

What is claimed is:

1. A test system comprising:
a test target system operating according to a system clock;
a test bus implemented using part or all of an input/output bus which is originally designed to transfer input and output data to and from the test target system;
a plurality of input circuits, each said input circuit including an associated input port and a first shift register operating according to a shift clock independent of the system clock to supply first data input from said associated input port to the test target system via the test bus; and
a plurality of output circuits, each said output circuit including an associated output port and a second shift register operating according to the shift clock to supply second data, which has been supplied from the test target system to the test bus, to said associated output port,
the plurality of first shift registers and the plurality of second shift registers being connected in series to form a scan oath chain,
wherein, when the test target system is tested, initial state setting is performed by circulating initial setting data in the scan path chain, and, after the system clock is activated, data of the input circuits is loaded into the associated first shift registers or other data of the output circuits is loaded into the associated second shift registers and the shift clock is activated to extract the data of the input circuits or the other data of the output circuits from the scan path chain,
wherein enable data is circulated in the scan path chain, and the other data of the output circuits is sent to the test bus only when the enable data is active,
wherein the test bus is m bits wide, m is an integer larger than 1, and the enable data has m consecutive active bits and has no active bit prior to and subsequent to the m consecutive active bits, and
wherein m-bit data of the output circuits having the active bits is output to the m-bit test bus by shifting the first and second shift registers according to the shift clock every m bits.

2. A test system comprising:
a test target system operating according to a system clock;
a test bus implemented using part or all of an input/output bus which is originally designed to transfer input and output data to and from the test target system;
a plurality of input circuits, each said input circuit including an associated input port and a first shift register operating according to a shift clock independent of the system clock to supply first data input from said associated input port to the test target system via the test bus; and
a plurality of output circuits, each said output circuit including an associated output port and a second shift register operating according to the shift clock to supply second data, which has been supplied from the test target system to the test bus, to said associated output port,
the plurality of first shift registers and the plurality of second shift registers being connected in series to form a scan oath chain,
wherein, when the test target system is tested, initial state setting is performed by circulating initial setting data in the scan path chain, and, after the system clock is activated, data of the input circuits is loaded into the associated first shift registers or other data of the output circuits is loaded into the associated second shift registers and the shift clock is activated to extract the data of the input circuits or the other data of the output circuits from the scan path chain,
wherein enable data is circulated in the scan path chain, and the other data of the output circuits is sent to the test bus only when the enable data is active,
wherein part of the input/output bus is used as the test bus,
wherein the test system further comprises:
a test data input terminal and a test data output terminal;
an input-side multiplexer, connected between the test data input terminal and an input portion of the input/output bus, for selecting the input/output bus based on an input control signal; and
an output-side multiplexer, connected between the test data output terminal and an output portion of the input/output bus, for selecting the input/output bus based on an output control signal, and
wherein the part of the input/output bus selected by the input-side multiplexer and the output-side multiplexer serves as the test bus.

3. The test system according to claim 2, wherein data input from the test data input terminal is sent to the test data output terminal via the test bus, bypassing the scan path chain.

* * * * *